US009568388B2

(12) United States Patent
Bousquet et al.

(10) Patent No.: US 9,568,388 B2
(45) Date of Patent: Feb. 14, 2017

(54) SMALL FORM FACTOR PRESSURE SENSOR

(71) Applicants: Cory Z. Bousquet, Cranston, RI (US);
June Park, Providence, RI (US)

(72) Inventors: Cory Z. Bousquet, Cranston, RI (US);
June Park, Providence, RI (US)

(73) Assignee: Sensata Technologies, Inc., Attleboro, MA (US)

( * ) Notice: Subject to any disclaimer, the term of this patent is extended or adjusted under 35 U.S.C. 154(b) by 221 days.

(21) Appl. No.: 14/451,926

(22) Filed: Aug. 5, 2014

(65) Prior Publication Data

US 2016/0041055 A1 Feb. 11, 2016

(51) Int. Cl.
| | |
|---|---|
| *G01L 19/00* | (2006.01) |
| *G01L 19/14* | (2006.01) |
| *G01R 1/067* | (2006.01) |
| *H01R 13/24* | (2006.01) |

(52) U.S. Cl.
CPC ....... *G01L 19/0061* (2013.01); *G01L 19/0069* (2013.01); *G01L 19/147* (2013.01); *G01L 19/148* (2013.01); *G01R 1/06716* (2013.01); *H01R 13/2421* (2013.01)

(58) Field of Classification Search
None
See application file for complete search history.

(56) References Cited

U.S. PATENT DOCUMENTS

| | | | |
|---|---|---|---|
| 2004/0147140 A1 | 7/2004 | Fan et al. | |
| 2008/0262584 A1* | 10/2008 | Bottomley | A61N 1/05 607/119 |
| 2009/0075529 A1* | 3/2009 | Johnston | H01R 13/2421 439/824 |
| 2010/0267291 A1* | 10/2010 | Chabineau-Lovgren | H01R 13/2421 439/817 |
| 2011/0108322 A1 | 5/2011 | Kaiser | |
| 2013/0192379 A1* | 8/2013 | Petrarca | G01L 9/00 73/754 |
| 2014/0219713 A1* | 8/2014 | Balsells | B21F 3/12 403/327 |

FOREIGN PATENT DOCUMENTS

| | | | | |
|---|---|---|---|---|
| EP | 2 390 641 A2 | 11/2011 | | |
| EP | 2620757 A1 * | 7/2013 | ............... | G01L 9/00 |
| GB | 2066590 A * | 7/1981 | ......... | G01R 1/06722 |

OTHER PUBLICATIONS

European Search Report, EP 15 17 6872, Jan. 12, 2016, pp. 2.

* cited by examiner

*Primary Examiner* — Andre Allen
(74) *Attorney, Agent, or Firm* — Chapin Intellectual Property Law, LLC

(57) ABSTRACT

A small form factor Microfused Silicon Strain gage (MSG) sensor incorporates an offset spring and feed-in features. A pressure sensor includes a spring having first and second coiled sections offset by a coiled center section in a middle that is used to make offset contact between two electrical contact pads.

12 Claims, 6 Drawing Sheets

SMALL FORM FACTOR PRESSURE SENSOR

BACKGROUND OF THE INVENTION

The invention relates generally to pressure sensors, and more specifically to a small form factor pressure sensor.

Pressure sensors that use Microfused Silicon Strain gage (MSG) technology have become popular for variety of applications, such as automotive brake systems, automotive stability control systems, GDI fuel pressure, transmission systems, and so forth. These pressure sensors are generally small in form. A preferred design for a small form factor MSG sensor, which can have an outside diameter of less than 15 mm, typically uses a single printed circuit board (PCB) that connects directly to customer electronics in order to minimize component count. In these small form factor MSG sensors, a location of sensor PCB contact pads is generally constrained to a minimum radial distance from a center of the package due to a window in a center of the PCB to enable wirebonding to a strain gage.

What is needed is a solution for making offset pad connection with a single spring.

SUMMARY OF THE INVENTION

The following presents a simplified summary of the innovation in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention provides methods and apparatus for a small form factor pressure sensor.

In general, in one aspect, the invention features a pressure sensor including a spring having first and second coiled sections offset by a coiled center section in a middle that is used to make offset contact between two electrical contact pads.

These and other features and advantages will be apparent from a reading of the following detailed description and a review of the associated drawings. It is to be understood that both the foregoing general description and the following detailed description are explanatory only and are not restrictive of aspects as claimed.

BRIEF DESCRIPTION OF THE DRAWINGS

The invention will be more fully understood by reference to the detailed description, in conjunction with the following figures, wherein.

DETAILED DESCRIPTION

Figure 1:
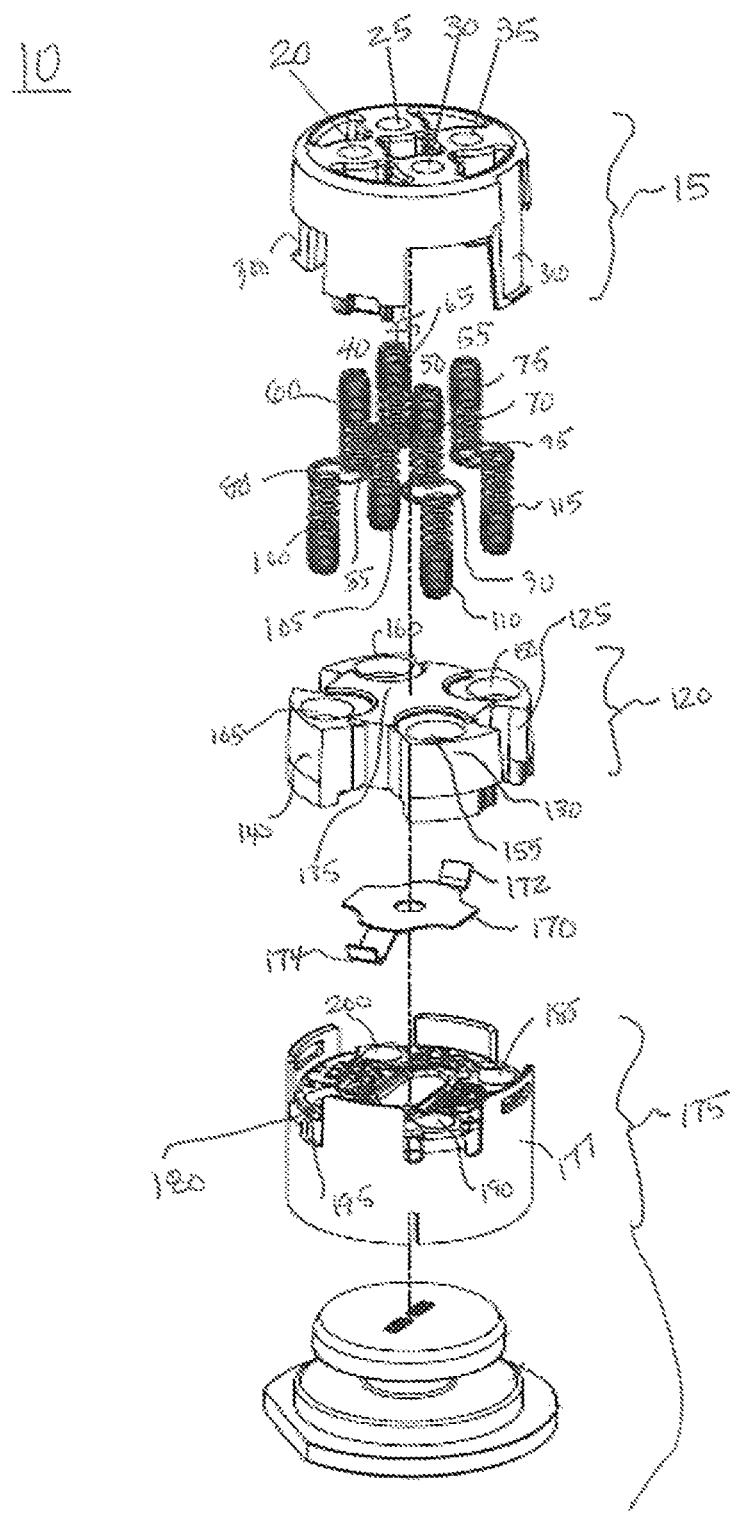
FIG. 1 exploded view of an exemplary small form factor MSG sensor in accordance with embodiments disclosed herein.

The subject innovation is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

In the description below, the term "or" is intended to mean an inclusive "or" rather than an exclusive "or." That is, unless specified otherwise, or clear from context, "X employs A or B" is intended to mean any of the natural inclusive permutations. That is, if X employs A, X employs B, or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

As shown in FIG. 1, an exemplary small form factor MSG sensor 10 includes upper spring guide housing 15. In the embodiment shown in FIG. 1, the upper spring guide housing 15 includes four bores 20, 25, 30, 35. In one specific embodiment, each bore is cylindrical. In other embodiments, each bore may take on other shapes to accommodate various shapes of the one or more offset springs, described below.

The sensor 10 includes four offset springs 40, 45, 50, 55, each having an upper offset segment 60, 65, 70, 75, respectively, a center section 80, 85, 90, 95, respectively, and lower offset segment 100, 105, 110, 115. In one specific design, the center sections 80, 85, 90, 95 are circular. The upper offset segments 60, 65, 70, 75 are oriented for positioning within the four bores 20, 25, 30, 35, respectively, of the upper spring guide housing 15.

The sensor 10 includes a lower spring guide housing 120. The lower spring guide housing 120 includes four bores 125, 130, 135, 140. The lower offset segments 100, 105, 110, 115 are oriented for positioning within the four bores 125, 130, 135, 140, respectively, of the lower spring guide housing 120.

To aid in positioning the lower offset segments 100, 105, 110, 115, each of the four bores 125, 130, 135, 140, includes an alignment and feeding portion 150, 155, 160, 165 formed at a proximal end. As is described below, each alignment and feeding portion 150, 155, 160, 165 is shaped in a tapered fashion to provide proper orientation and alignment of each of the lower offset segments 100, 105, 110, 115.

The sensor 10 includes a EMC shield 170. The EMC shield 170 is grounded by bent metal features 172, 174 creating leaf springs from the EMC shield 170 itself. A secondary attachment of the heat stake is used to ensure shield location over time. The EMC shield 170 creates a Faraday cage for electromagnetic compatibility performance improvement. The EMC shield 170 eliminates a need for an external housing to function as an electromagnetic compliance shield. In addition, by making the EMC shield 170 internal, electromagnetic compliance is improved without reducing available printed circuit board population area. Making the EMC shield 170 internal maximizes a PCB diameter and provides shielding.

The sensor 10 includes an electronics module assembly (EMA) 175 that includes a support ring 177 and a printed circuit board (PCB) 180. When coupled to the lower spring guide housing 120, ends of each of the lower offset segments 100, 105, 110, 115 mate with contact pads 185, 190, 195, 200 located on the PCB 180.

When fully assembled, the upper spring guide housing 15, the lower spring guide housing 120, the EMC shield 170 and the EMA 175 are interlocked or coupled together to form the assembled sensor 10. Guides 300 located in the upper spring guide housing 15 are configured to directly align into the support ring 175. In one embodiment, snap fits and crush ribs in the guides 300 are incorporated to reduce tolerance stack-up, i.e., improve spring positioning.

Figure 2:
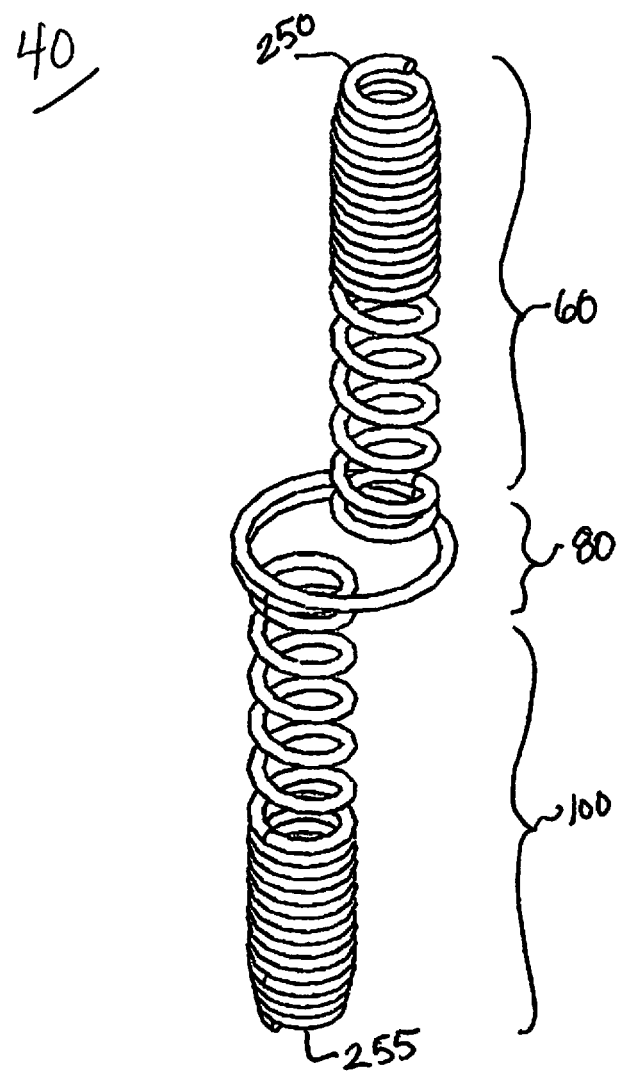
FIG. 2 is an illustration of an exemplary offset spring in accordance with embodiments disclosed herein.

As shown in FIG. 2, each of the offset springs, offset spring 40 for example, includes the upper offset segment 60, the center section 80 and the lower offset segment 100. The upper offset segment 60 and the lower offset segment 100 are smaller diameter coiled structures linked together by a coiled center section 80. A top tip 250 of the upper offset segment 60 is designed to make contact with a pad of customer equipment (not shown) while a bottom tip 255 of the lower offset segment 100 is designed to make contact with the contact pad 185 located on the PCB 180.

Figure 3:
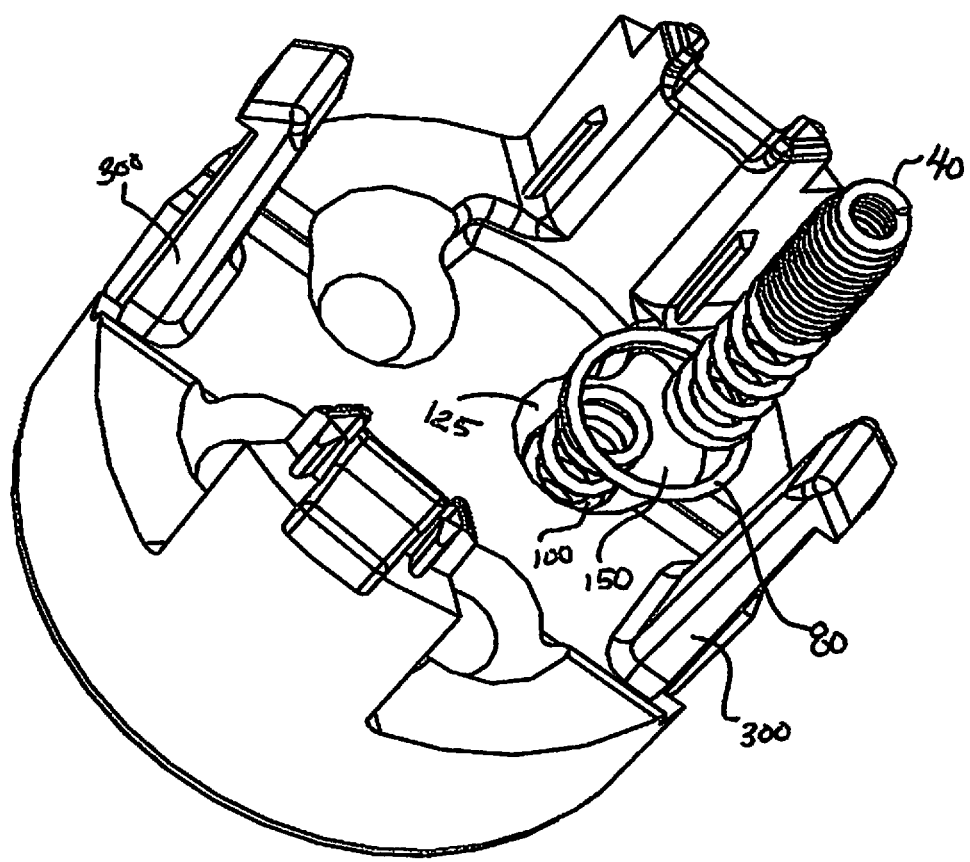
FIG. 3 is an illustration of an alignment recess.

As shown in FIG. 3, each of the four bores 125, 130, 135, 140 of the lower spring guide housing 120, bore 125 for example, includes the alignment and feeding portion 150. By way of example, during assembly of the sensor 10, the lower offset segment 100 is dropped into the bore 125. To insure that the offset spring 40 is position correctly, its center section 80 falls to rest into the recessed alignment and feeding portion 150. This prevents the offset spring 40 from rotating and positions the lower offset segment 100 for proper contact with the contact pad 185 located on the PCB 180 and for proper contact of the upper offset segment 60 with the pad of customer equipment (not shown). More specifically, the alignment and feeding portion 150 is a counterbore that accepts the coiled center section 80 to rotationally align the offset spring 40 prior to installation of the upper spring guide housing 15.

Figure 4:
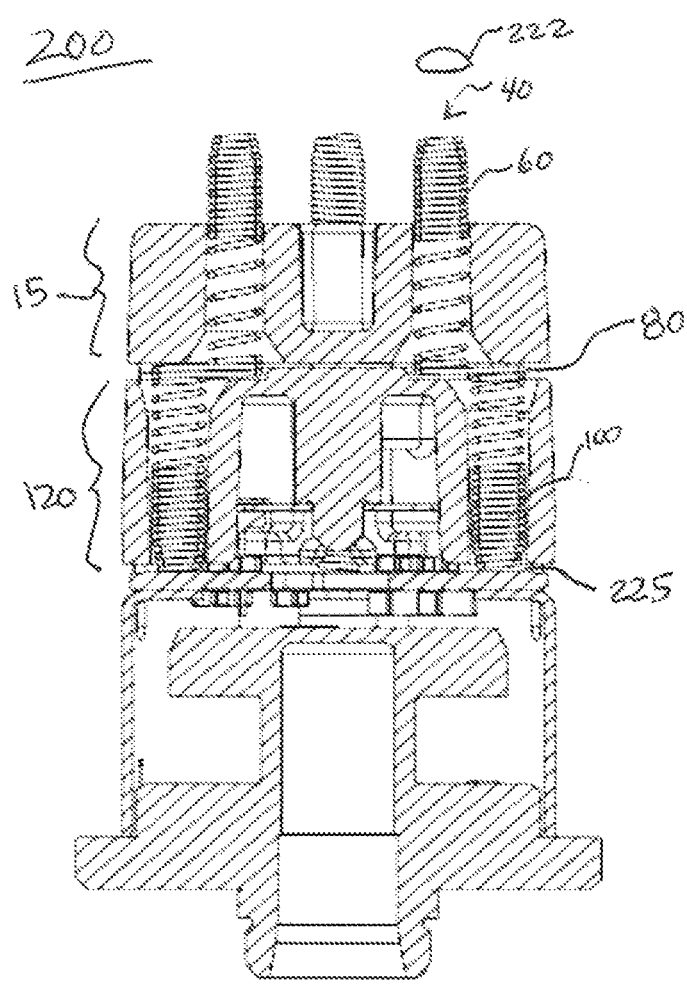
FIG. 4 is a cross-sectional view of an assembled MSG sensor in accordance with embodiments disclosed herein.

As shown in FIG. 4, a cross-sectional view of an exemplary assembled MSG sensor 200 includes the spring 40 with two coiled sections 60, 100 offset by the coiled center section 80 in the middle that is used to make offset contact between two pads 222, 225. The offset amount is determined by subtracting the active coil diameter from the major center section diameter. The spring 40 is assembled into the sensor 200 having two plastic pieces 15, 120 where each active section of the spring 40 is contained on one side. The two plastic parts 15, 120 join at the offset spring interface 80.

The plastic components 15, 120 are designed such that the forces generated when the spring 40 is compressed is supported in the normal direction by the mating force. That is, the lower active portion 100 of the spring 40 bears on the upper plastic spring guide interface and the upper active spring portion 60 bears on a lower plastic guide surface.

The bores in the plastic components 15, 120 contain feed-in features to aid in spring loading as well as to accommodate positional tolerance between the active sections 60, 100. Furthermore, the first plastic retainer 15 contains a counterbored feature to accept the center coiled section 80 to rotationally align the spring prior to installation of the second plastic retainer 120. In one embodiment, a keyed feature with deformable crush ribs is included to provide positioning and anti-rotation to prevent damage or binding of the springs due to relative motion of the plastic guides (labeled as 300 in FIG. 1 and FIG. 3).

Although the pressure sensor of the present invention has been described wherein the offset spring includes a circular coiled center section, other implementations can include alternate offset spring configurations that include corresponding modifications to the respective alignment and feeding portions of the bore.

Figure 5:
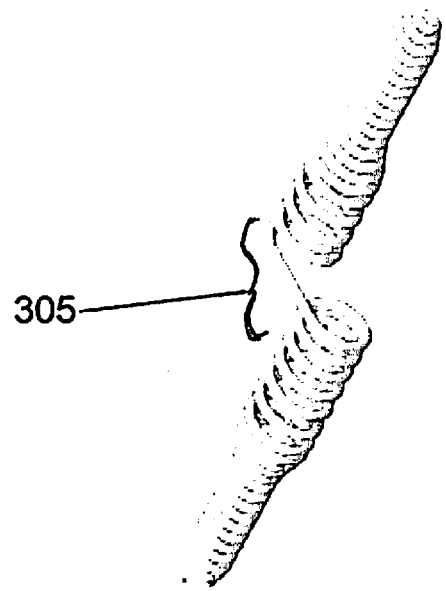
FIG. 5 illustrates a second embodiment of an offset spring.

For example, as shown in FIG. 5, in one implementation, an offset spring 300 includes a single direction winding center section 305.

Figure 6:
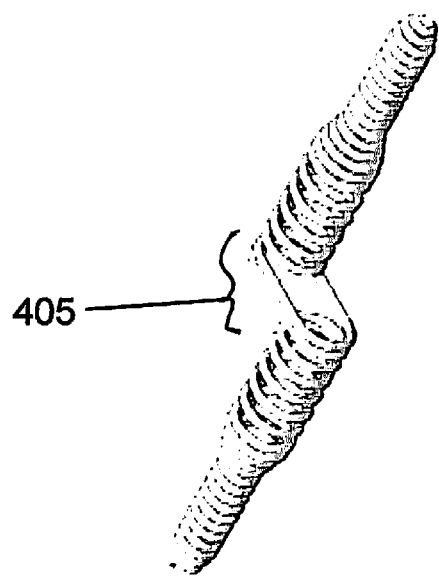
FIG. 6 illustrates a third embodiment of an offset spring.

In another implementation, as shown in FIG. 6, an offset spring 400 includes a full wind on a center section 405 to eliminate tangling.

Figure 7:
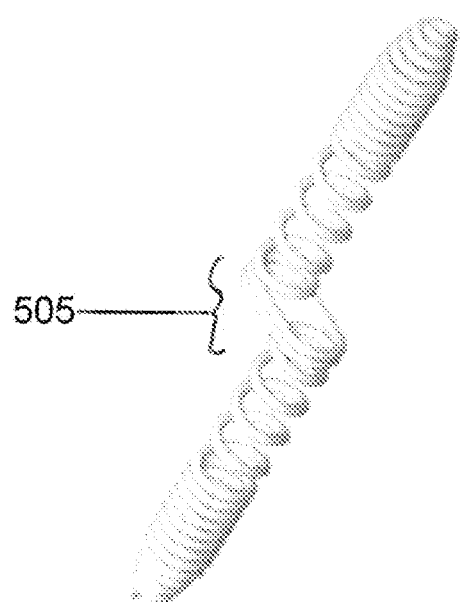
FIG. 7 illustrates a fourth embodiment of an offset spring.

In still another implementation, as shown in FIG. 7, an offset spring 500 includes a center section 505 that eliminates dual diameters.

Some embodiments may be described using the expression "one embodiment" or "an embodiment" along with their derivatives. These terms mean that a particular feature, structure, or characteristic described in connection with the embodiment is included in at least one embodiment. The appearances of the phrase "in one embodiment" in various places in the specification are not necessarily all referring to the same embodiment.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

What is claimed is:

1. A pressure sensor comprising:
    a spring having first and second coiled sections connected to and offset by a coiled center section in a middle of the spring that is used to make offset contact between two electrical contact pads; and
    first and second housing interlocking components where the first coiled section is contained within a bore of the first housing interlocking component and the second coiled section is contained in a bore of the second housing interlocking component, the first and second housing interlocking components joined at the coiled center section of the spring.

2. The pressure sensor of claim 1 wherein the offset comprises an approximate offset amount determined by subtracting an active coil diameter of the first and second coiled sections from a diameter of the coiled center section.

3. The pressure sensor of claim 1 wherein the first housing interlocking component is designed such that a force generated when the spring is compressed is supported in a normal direction by a mating force of the second housing interlocking.

4. The pressure sensor of claim 1 wherein the bores in the first and second housing interlocking components comprise feed-in features to aid in spring loading and accommodate positional tolerance between the first and second coiled sections.

5. The pressure sensor of claim 1 wherein the bore in the first housing interlocking component comprises a counterbored feature to accept the center coiled section to rotationally align the spring prior to installation of the second interlocking component.

6. The pressure sensor of claim 5 wherein the first housing interlocking component further comprises a keyed alignment guide with deformable crush ribs regions to accept crush ribs from the second interlocking component to provide positioning and anti-rotation to prevent damage or binding of the spring.

7. The pressure sensor of claim 1 wherein the first and second housing interlocking components are injection molded plastic.

8. The pressure sensor of claim 1 wherein the center section enables spring retention by the first housing interlocking component and the second housing interlocking component.

9. The pressure sensor of claim 1 further comprising an electronics module assembly adapted to snap fit to the first and second housing interlocking components.

10. The pressure sensor of claim 9 wherein the electronics module assembly comprises:
   a support ring; and
   a printed circuit board.

11. The pressure sensor of claim 10 wherein the support ring comprises one or more strain gages coupled to a sense element.

12. The pressure sensor of claim 9 further comprising an EMC shield positioned between the electronics module assembly and the first and second housing interlocking components, the EMC shield grounded by bent metal features.

\* \* \* \* \*